United States Patent
Adamcek et al.

(10) Patent No.: US 6,495,429 B1
(45) Date of Patent: Dec. 17, 2002

(54) CONTROLLING INTERNAL THERMAL OXIDATION AND ELIMINATING DEEP DIVOTS IN SIMOX BY CHLORINE-BASED ANNEALING

(75) Inventors: Michael E. Adamcek, Wappingers Falls, NY (US); Anthony G. Domenicucci, New Paltz, NY (US); Stephen R. Fox, Hopewell Junction, NY (US); Neena Garg, Fishkill, NY (US); Kenneth J. Giewont, Hopewell Junction, NY (US); Thomas R. Kupiec, Poughkeepsie, NY (US); Junedong Lee, Hopewell Junction, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/055,139

(22) Filed: Jan. 23, 2002

(51) Int. Cl.⁷ ............................................. H01L 21/76
(52) U.S. Cl. ....................................... 438/407; 438/480
(58) Field of Search ................................. 438/407, 480, 438/766

(56) References Cited

U.S. PATENT DOCUMENTS

| | | | | |
|---|---|---|---|---|
| 4,749,660 A | * | 6/1988 | Short et al. .................. 438/407 |
| 4,786,608 A | * | 11/1988 | Griffith ....................... 438/407 |
| 4,810,664 A | * | 3/1989 | Kamins et al. ............. 357/23.7 |
| 4,902,642 A | * | 2/1990 | Mao et al. ............. 148/DIG. 70 |
| 4,975,126 A | * | 12/1990 | Margail et al. ............. 145/33.2 |
| 5,143,858 A | * | 9/1992 | Tomozane et al. ........... 438/407 |
| 5,279,978 A | * | 1/1994 | See et al. ............... 148/DIG. 9 |
| 5,288,650 A | * | 2/1994 | Sandow ....................... 438/407 |
| 5,405,795 A | * | 4/1995 | Beyer et al. ........ 148/DIG. 150 |
| 5,468,657 A | * | 11/1995 | Hsu ............................ 438/407 |
| 5,519,336 A | * | 5/1996 | Liu et al. ..................... 324/769 |
| 5,548,149 A | * | 8/1996 | Joyner et al. ................ 257/347 |
| 5,589,407 A | * | 12/1996 | Meyyappan et al. ........ 438/407 |
| 5,795,800 A | * | 8/1998 | Chan et al. .................. 438/149 |
| 5,891,265 A | * | 4/1999 | Nakai et al. ............... 148/33.3 |
| 6,043,166 A | * | 3/2000 | Roitman et al. ............. 438/766 |
| 6,090,689 A | * | 7/2000 | Sadana et al. .............. 438/480 |
| 6,180,487 B1 | * | 1/2001 | Lin ............................. 438/407 |

OTHER PUBLICATIONS

Sorab K. Ghandhi VLSI Fabrication Principles John Wiley and Sons 1994 p. 432.*

* cited by examiner

Primary Examiner—Olik Chaudhuri
Assistant Examiner—David S. Blum
(74) Attorney, Agent, or Firm—Scully, Scott, Murphy & Presser; Robert M. Trepp, Esq.

(57) ABSTRACT

A method to control the quality of a buried oxide region, and to substantially reduce or eliminate deep divots in SOI substrates is provided. Specifically, the inventive method includes the steps of implanting oxygen ions into a surface of a Si-containing substrate; and annealing the Si-containing substrate containing the implanted oxygen ion at a temperature of about 1300° C. or above and in a chlorine-containing ambient so as to form a buried oxide region that electrically isolates a superficial Si-containing layer from a bottom Si-containing layer. The chlorine-containing ambient employed in the annealing step includes oxygen and a chlorine-containing carrier gas such as HCl, methylene chloride, trichloroethylene and trans 1,2-dichloroethane.

33 Claims, 7 Drawing Sheets

1

CONTROLLING INTERNAL THERMAL OXIDATION AND ELIMINATING DEEP DIVOTS IN SIMOX BY CHLORINE-BASED ANNEALING

RELATED APPLICATION

This application is related to co-assigned and co-pending U.S. application Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 the entire contents of each of which is incorporated herein by reference.

FIELD OF THE INVENTION

The present invention relates to silicon-on-insulator (SOI) substrates, and more particularly to a separation by implantation of oxygen (SIMOX) process in which internal thermal oxidation (ITOX) is sufficiently controlled so as to improve the circuit yield of the SOI substrate. The circuit yield can be increased in the present invention by improving the quality of the buried oxide (BOX) region and/or by decreasing the deep divot density.

BACKGROUND OF THE INVENTION

During some SIMOX processes such as described, for example, in U.S. Pat. No. 5,930,643 to Sadana, et al., extensive internal thermal oxidation (ITOX) takes place in the oxygen implanted region of the Si-containing substrate during high-temperature (on the order of about 1300° C. or higher) annealing in an oxidizing ambient.

FIG. 1 is a graph of ITOX thickness (Å) vs. surface oxidation thickness (Å) for typical SIMOX processes in which ITOX is occurring. Specifically, FIG. 1 shows how ITOX thickness depends on the surface oxide thickness formed during high-temperature annealing. As is shown, ITOX thickness increases with increasing surface oxide thickness.

Internal therm oxidation has both beneficial and detrimental effects on the quality of low-dose SIMOX processes. The beneficial effects that are obtained from ITOX include: (i) formation of a thermal oxide cap layer over the implanted oxide thereby increasing the overall thickness of the BOX region; (ii) improvement in the continuity of the BOX; and (iii) improvement in the electrical quality of the BOX region as measured by its breakdown field.

The detrimental effect of ITOX includes the formation of deep divots in the superficial Si layer (i.e., top Si layer that overlays the BOX region) of a SOI substrate which could be a device killer and impact circuit yield adversely.

The prior art SIMOX processes in which ITOX is a factor do not provide adequate control of this phenomena. Control of ITOX is important for various reasons. For example, the quality of the BOX region relates directly to the yield of microprocessors and memory devices such as dynamic random access memories (DRAMs) and static random access memories (SRAMs). Lowering the quality of the BOX region (i.e., lower the breakdown voltage) lowers the circuit yield. Similarly, the higher the deep divot density, the lower the circuit yield is. Both of these phenomena are directly related to ITOX which may occur during the high-temperature annealing step of conventional SIMOX processes.

In view of the above drawbacks with conventional SIMOX processes, there is a continued need for providing a new and improved SIMOX process in which ITOX is sufficiently controlled so as to improve the circuit yield of the SOI substrate.

SUMMARY OF THE INVENTION

One object of the present invention is to provide a SIMOX process in which ITOX is sufficiently controlled so as to be capable of adjusting the BOX thickness formed during the process.

Another object of the present invention is to provide a SIMOX process in which ITOX is sufficiently controlled so as to improve the quality of the BOX region.

A further object of the present invention is to provide a SIMOX process in which ITOX is sufficiently controlled so as to substantially decrease or eliminate the deep divot defects that are present in the top, i.e., superficial, Si-containing layer of a SOI substrate.

A yet further object of the present invention is to provide a SIMOX process in which no additional steps besides implanting and annealing are employed in forming a BOX region within a Si-containing substrate.

An even further object of the present invention is to provide a SIMOX process in which conventional ion implants are employed, and control of ITOX is achieved by changing the ambient employed during the annealing step.

These and other objects and advantages are achieved in the present invention by providing a SIMOX process in which ITOX is controlled by adding a chlorine-containing carrier gas to the annealing ambient during high-ternperature annealing.

Specifically, the present invention provides a method to control the quality of the BOX region formed during a SIMOX process, and to substantially reduce or eliminate deep divots in SOI substrates. The inventive method comprises the steps of:

implanting oxygen ions into a surface of a Si-containing substrate; and annealing said Si-containing substrate containing said implanted oxygen ions at a temperature of about 1000° C. or above and in a chlorine-containing ambient so as to form a buried oxide region that electrically isolates a superficial Si-containing layer from a bottom Si-containing layer.

The method of the present invention, which employs a chlorine-containing ambient during annealing, provides SOI substrates having a high quality (in terms of structural and electrical properties) BOX region and a superficial Si-containing layer that has a reduced number of divot defects present therein.

The term "high structural quality" is used herein to denote a SOI substrate which has little or no etch pitch density (less than about 1E5 $cm^2$); little or no top or bottom superficial Si/buried oxide roughness (surface roughness of less than about 100 Å as measured by TEM (transmission electron microscopy); a low HF-defect density (less than about 1 $cm^2$); and a low surface roughness (of about 6 Å root mean square).

The term "high electrical quality" is used herein to denote a structure wherein the buried oxide breakdown field is high (greater than about 5 megavolts per cm); the buried oxide minibreakdown voltage is high (greater than about 35 volts); the buried oxide leakage at a given voltage is low (less than about 1 nanoAmp); and the buried oxide short density is low (less than about 1 $cm^{-2}$).

DETAILED DESCRIPTION OF THE INVENTION

Figure 1:
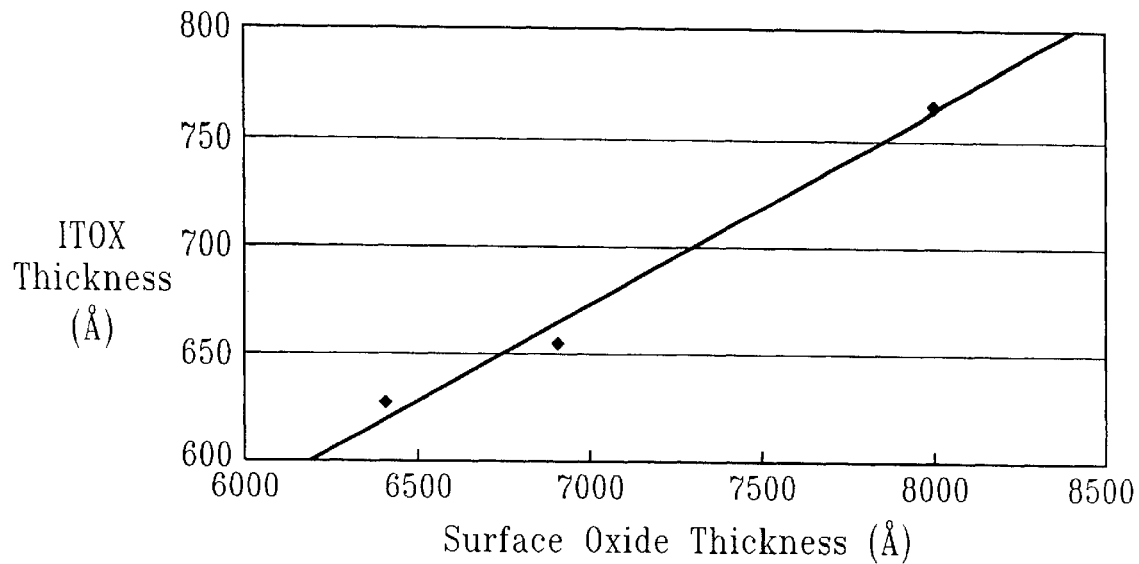
FIG. 1 is a graph plotting ITOX thickness (Å) vs. surface oxidation thickness (Å) for prior art SIMOX processes in which ITOX is occurring. Specifically, this graph shows the relationship between surface oxidation and ITOX.

The present invention which provides a method for controlling ITOX and substantially reducing or eliminating deep divots formed in the superficial Si-containing layer will now be described in more detail by referring to FIGS. 2–7 that accompany the present invention. Note that in these drawings like and/or corresponding elements are referred to by like reference numerals.

Figure 2A:
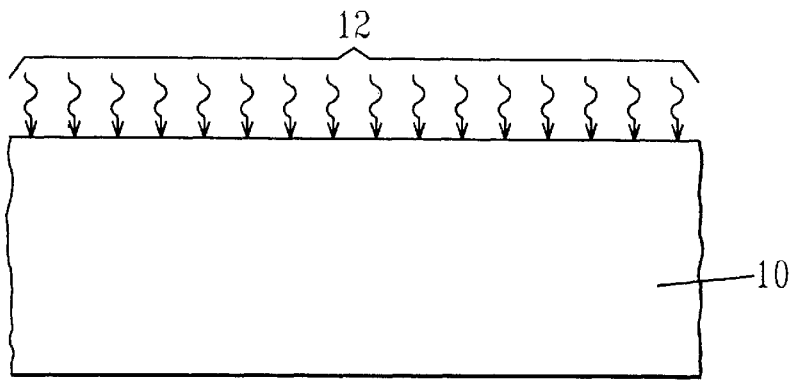
FIGS. 2A–2C are pictorial representations (through cross-sectional views) illustrating the fabrication of a SOI substrate through various processing steps of the present invention.
Figure 2B:
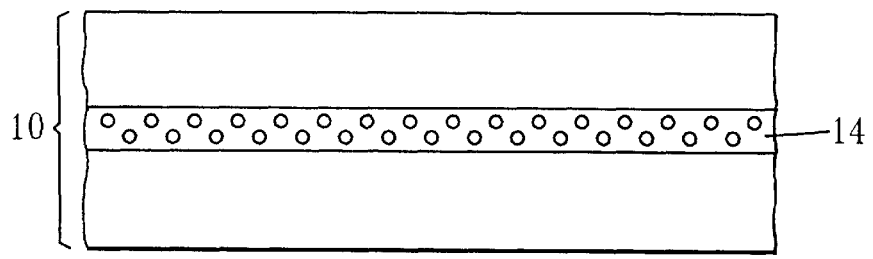
Figure 2C:
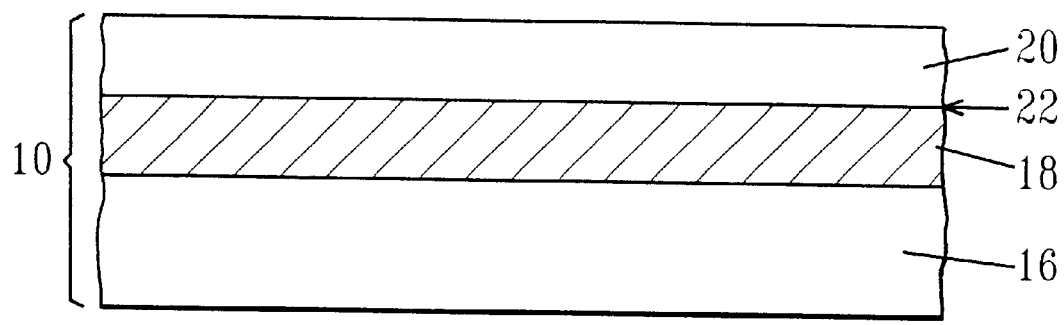

Reference is first made to FIGS. 2A–2C which are pictorial representations that illustrate the various processing steps that are employed in the present invention in fabricating a SOI substrate having a high quality BOX region and a superficial Si-containing layer that has a reduced number of divot defects formed therein.

In accordance with the inventive method and as depicted in FIG. 2A, the SOI substrate is first formed by implanting oxygen ions 12 into a surface of Si-containing substrate 10. This oxygen ion implant step may be carried out in a pulse or continuous mode. The structure shown in FIG. 2A is formed using conventional materials that are well known in the art and conventional oxygen ion implants are also employed in forming the same.

For example, Si-containing substrate 10 includes any Si-containing material such as Si, SiGe, SiC, SiCGe, nitrogen-doped Si, Si/Si, and Si/SiGe. A preferred Si-containing substrate employed in the present invention is a Si wafer. The substrate may be undoped or doped (n or p-type) depending on the future use of the SOI substrate.

As stated above, conventional SIMOX implants that are well known to those skilled in the art can be employed in the present invention. In addition, the ion implantation conditions described in co-assigned U.S. Pat. No. 5,930,643 to Sadana, et al.; U.S. Pat. No. 6,043,166 to Roitman, et al.; and U.S. Pat. No. 6,090,689 to Sadana, et al., the entire contents of each of which is incorporated herein by reference, may be employed in the present invention.

Although conventional ion implants can be employed in the present invention, the following description provides some more details of the different types of oxygen ion implants that maybe employed in the present invention.

I. High-dose oxygen ion implantation: The term "high-dose" as used herein denotes an oxygen ion dosage of about $4E17$ cm$^{-2}$ or greater, with an oxygen ion dosage of from about $4E17$ to about $2E18$ cm$^{-2}$ being more preferred. In addition to using high-oxygen dosage, this implant is typically carried out in an ion implantation apparatus that operates at a beam current of from about 0.05 to about 500 milliamps cm$^{-2}$ and at an energy of from about 150 to about 1000 keV. More preferably, this implant is carried out using an energy of from about 150 to about 210 keV.

This implant, which may be referred to as a base ion implant, is carried out at a temperature of from about 200° to about 800° C. at a beam current density of from about 0.05 to about 500 mA cm$^{-2}$. More preferably, the base ion implant may be carried out at a temperature of from about 200° to about 600° C. at a beam current density of from about 4 to about 8 mA cm$^{-2}$.

If desired, the base oxygen implant step may be followed by a second oxygen implant that is carried out using an oxygen dose of from about $1E14$ to about $1E16$ cm$^{-2}$, with an oxygen dose of from about $1E15$ to about $4E15$ cm$^{-2}$ being more highly preferred. The second oxygen implant is carried out at an energy of from about 40 keV or greater, with an energy of from about 120 to about 450 keV being more preferred.

This second implant is performed at a temperature of from about 4 K to about 200° C. with a current density of from about 0.05 to about 10 mA cm$^{-2}$. More preferably, the second oxygen implant may be performed at a temperature of from about 25° to about 100° C. with a beam current density of from about 0.5 to about 5.0 mA cm$^{-2}$.

Note that the second oxygen implant forms an amorphous region below the damaged region caused by the base ion implant step. During the subsequent annealing, the amorphous and damaged region are converted into a buried oxide (i.e., BOX) region.

II. Low-dose oxygen implant: The term "low-dose" as used herein for this embodiment of the present invention denotes an oxygen ion dose of about $4E17$ cm 2 or less, with an oxygen ion dose of from about $1E16$ to about $3.9E17$ cm$^{-2}$ being more preferred. This low-dose implant is performed at an energy of from about 40 to about 10000 keV, with an implant energy of from about 40 to about 210 keV being more highly preferred.

This implant, which may be referred to as a base ion implant, is carried out at a temperature of from about 100° to about 800° C. More preferably, the base ion implant may be carried out at a temperature of from about 200° to about 650° C. with a beam current density of from about 0.05 to about 500 mA cm$^{-2}$.

If desired, the base oxygen implant step may be followed by a second oxygen implant that is carried out using the conditions mentioned above.

It is again emphasized that the above types of oxygen ion implantations are exemplary and by no way limit the scope of the present invention. Instead, the present invention contemplates all conventional oxygen ion implants that are typically employed in conventional SIMOX processes.

It is noted that the oxygen ion implant step forms a region of implanted oxygen ions within the surface of the Si-containing substrate of sufficient concentration that is capable of forming a BOX region during a subsequent annealing step. The region of oxygen ion implants formed in the Si-containing substrate is shown, for example, in FIG. 2B. Note that reference numeral 14 is used to denote the implanted oxygen ion region formed within the Si-containing substrate.

Following the implantation of oxygen ions into the surface of the Si-containing substrate, the substrate containing implanted oxygen ions is then subjected to an annealing step which is performed under conditions wherein the implanted oxygen ions form a buried oxide region which electrically isolates a superficial Si-containing layer from a bottom Si-containing layer. Moreover, the annealing is unlike prior art SIMOX annealing steps in that the anneal conditions employed in the present invention essentially control ITOX as well as substantially reduce the number of divot defects present in the superficial Si-containing layer.

In accordance with the present invention, ITOX control and divot defect reduction (or elimination) is obtained by utilizing an annealing step wherein the ambient gas used contains a chlorine-containing carrier gas. Specifically, the annealing step of the present invention is carried out using from about 0.1 to about 99.9% oxygen and from about $1 \times 10^{-4}$ to about 3.0% of at least one chlorine-containing carrier gas. More preferably, the annealing step of the present invention is carried out in an ambient gas the comprises from about 5 to about 70% oxygen and from about 0.03 to about 3% of at least one chlorine-containing carrier gas. It is noted that the term "chlorine-containing ambient" is used herein to denote the mixture of oxygen and chlorine-containing carrier gas employed in the present invention.

In accordance with the present invention, the chlorine-containing carrier gas is formed by bubbling an inert gas such as argon, helium or nitrogen through a vessel which includes at least one chlorine-containing compound (the at least one chlorine-containing compound is typically in liquid form). The flow rate of the inert gas that is employed to generate the chlorine-containing carrier gas may vary.

Illustrative examples. of chlorine-containing compounds that can be employed in the present invention include, but are not limited to: HCl, trichloroethylene (TCE which is commercially known as TCA), trans 1,2-dichloroethane (TLC), methylene chloride, and other chlorine-containing organic or inorganic compounds. Mixtures of these chlorine-containing compounds are also contemplated herein. Of these chlorine-containing compounds, it is preferred to employ TCA or TLC in the present invention.

If available in gaseous form, the above mentioned chlorine-containing compounds can be used without the need of bubbling an inert gas through a chlorine-containing liquid.

Notwithstanding the type of chlorine-containing carrier gas employed in the present invention, annealing is typically performed at a temperature of from about 1100° to about 1400° C. for a time period of from about 1 to about 1000 hours. More preferably, annealing is performed at a temperature of from about 1300° to about 1350° C. for a time period of from about 2 to about 50 hours.

The annealing step may be carried out by simply heating the Si-containing substrate at a specific ramp temperature to the targeted temperature, or various ramp and soak cycles may be employed. During the various ramp and soak cycles it is possible to vary the content of the annealing ambient within the ranges mentioned above. Also, it is possible to change the annealing ambient gas mixture during the various ramp and soak cycles. The parameters for the ramp and soak cycles are clearly mentioned in previously incorporated U.S. Pat. No. 5,930,643 to Sadana, et al; therefore, it is not necessary to repeat the parameters herein. Note that the parameters for the ramp and soak cycles in the '643 patent may be adjusted herein to achieve formation of the inventive SOI substrate. For example, the ramp rate (heating and/or cooling) may be adjusted to be within the range of from about 0.1° C./min to about 10° C./min.

The resultant SOI substrate that is formed after the annealing step is shown, for example, in FIG. 2C. Specifically, the SOI substrate shown in this drawing includes BOX region 18 that electrically isolates superficial Si-containing layer 20 from bottom Si-containing layer 16. Note that in this embodiment of the present invention, the BOX region is continuous within the Si-containing substrate and that a substantially uniform interface (denoted as 22) exists between the BOX regions and the superficial Si-containing layer.

Figure 3A:
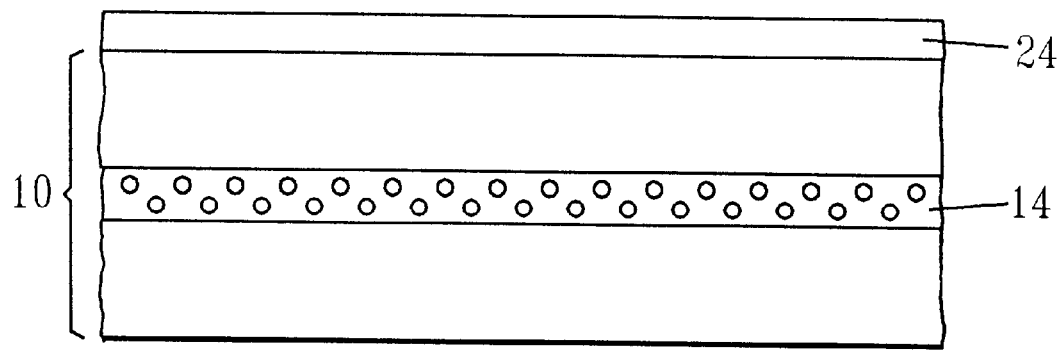
FIGS. 3A–3B are pictorial representations (through cross-sectional views) illustrating one optional embodiment of the present invention.
Figure 3B:
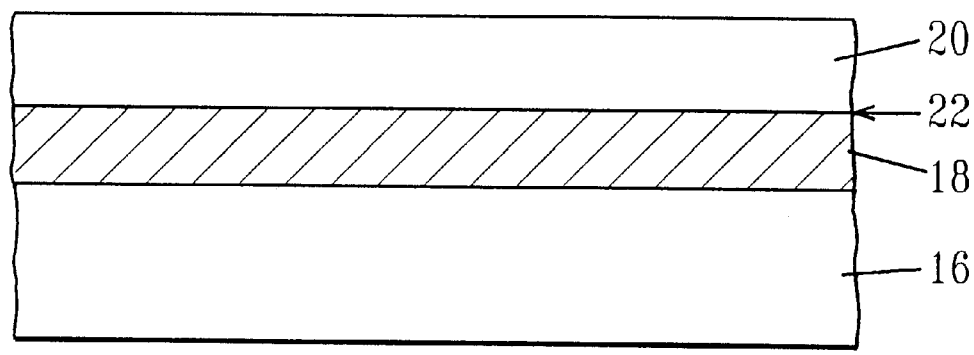

One optional, but highly preferred embodiment of the present invention is shown in FIGS. 3A–3B. In this optional embodiment, a Si layer, i.e., layer 24, is formed on the Si-containing substrate which contains oxygen ion implant region 14. This structure which is shown, for example, in FIG. 3A, includes the oxygen ion implant step described hereinabove as well as a step of forming a Si layer of the surface of the Si-containing substrate. In accordance with the present invention, the Si layer includes amorphous Si, polycrystalline Si (i.e., polySi), epitaxial Si (i.e., epi-Si) and combinations and multilayers thereof.

The Si layer is formed on the surface of the Si-containing substrate using conventional deposition processes well known to those skilled in the art. For example, Si layer 24 may be formed by chemical vapor deposition (CVD), plasma-enhanced chemical vapor deposition (PECVD), low-pressure chemical vapor deposition (LPCVD), sputtering, evaporation and chemical solution deposition. Alternatively, the Si layer may be formed by using a conventional epitaxial growth method.

The thickness of the Si layer formed on the Si-containing substrate may vary depending upon the required thickness necessary to achieve the formation of a BOX region having the above-mentioned properties. Typically, in the present invention, Si layer 24 has a thickness of from about 1 to about 10,000 Å, with a thickness of from about 500 to about 3000 Å being more preferred.

Following formation of the Si layer on the surface of the Si-containing substrate, the structure is subjected to the above-mentioned annealing step providing the structure shown in FIG. 3B.

In addition to forming continuous BOX regions within the Si-containing substrate as shown, for example, in FIGS. 2C and 3B, the present invention also works in cases wherein discrete and isolated BOX regions are formed within a surface of a Si-containing substrate. This embodiment of the present invention is shown, for example, in FIGS. 4A–4F. Note FIGS. 4A–4D show one possible embodiment wherein discrete BOX regions are formed within the Si-containing substrate, while FIGS. 4E–4F shows another possible embodiment of forming discrete and isolated BOX regions within the substrate.

Figure 4A:
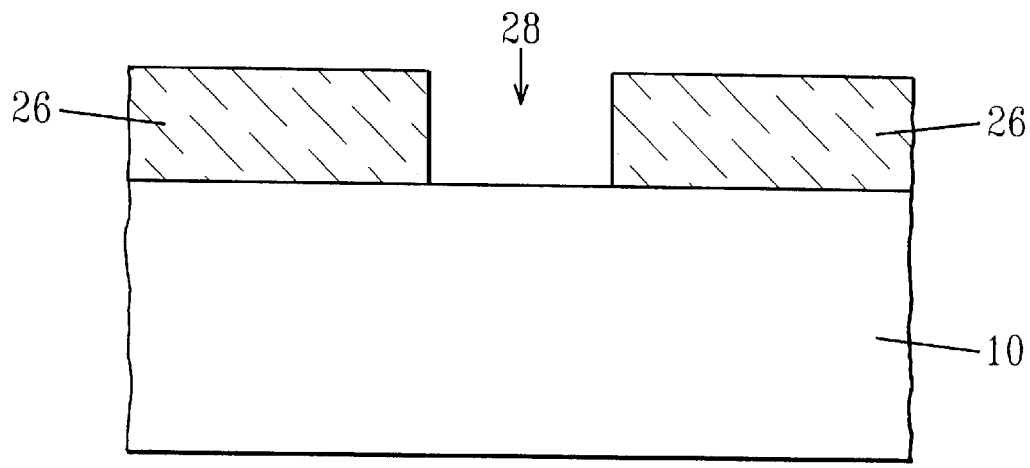
FIGS. 4A–4G are pictorial representations (through cross-sectional views) illustrating other optional embodiments of the present invention.

In regard to the embodiment shown in FIGS. 4A–D, the structure shown in FIG. 4A comprises a Si-containing substrate 10 having patterned mask 26 formed on a surface thereof. The patterned mask is composed of a dielectric material such as an oxide, nitride, oxynitride or multilayers thereof. The patterned mask is formed by depositing a layer of dielectric material on the surface of the Si-containing substrate by utilizing a conventional deposition process such as chemical vapor deposition (CVD), plasma-assisted CVD, sputtering, evaporation or chemical solution deposition. Alternatively, the dielectric material may be applied by a thermal oxidation, nitridation or oxynitridation process. After application of the dielectric material, conventional lithography and etching is employed in patterning the same. Note that the patterned mask contains at least one opening 28 that exposes a surface of the Si-containing substrate.

Figure 4B:
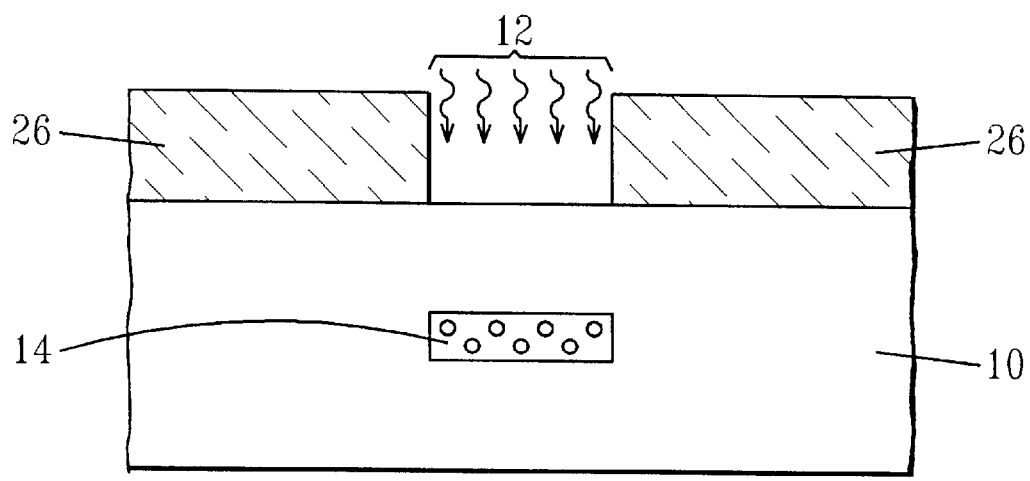

Next, and as shown in FIG. 4B, oxygen ions 12 are implanted through the at least one opening in the patterned mask into the Si-containing substrate using one of the above-mentioned oxygen ion implantation processes. Note that region 14, i.e., region of implanted oxygen ions, is formed in the Si-containing substrate during the implantation process.

After the ion implant step, the patterned mask may be removed using conventional stripping processes well known in the art and Si layer 24 may optionally be formed on the surface of the Si-containing substrate. This structure which includes the optional Si layer is shown, for example, in FIG. 4C. Note that although the Si layer is optional, it is preferred in some embodiments of the present invention.

Figure 4C:
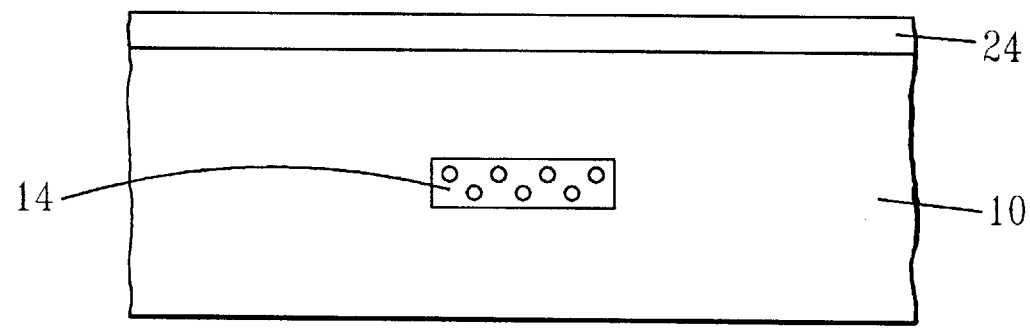
Figure 4D:
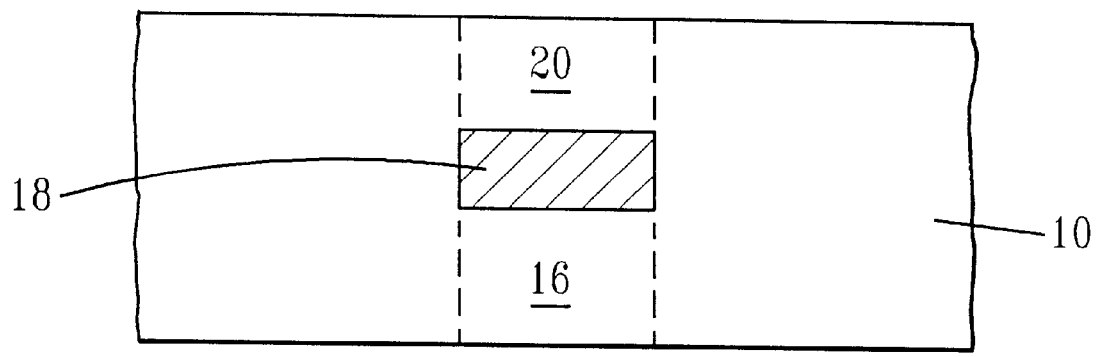
Figure 4E:
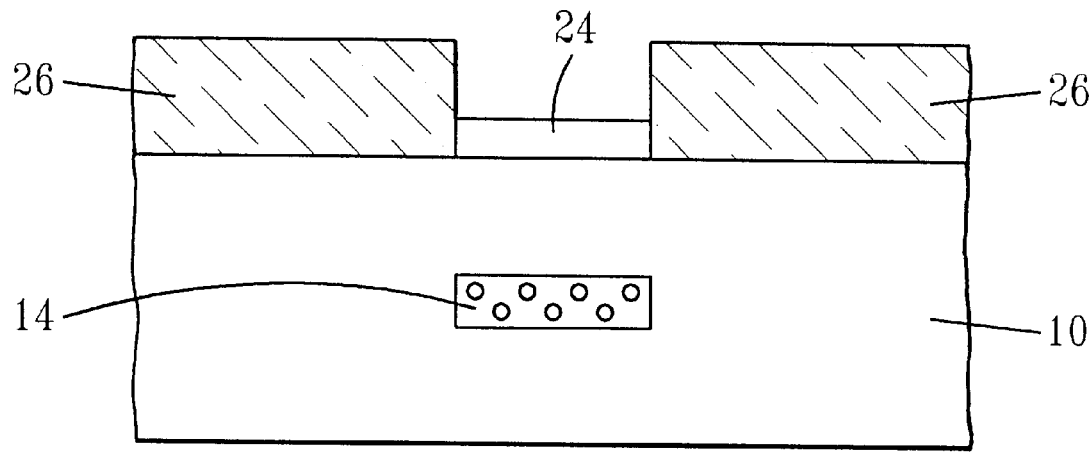
Figure 4F:
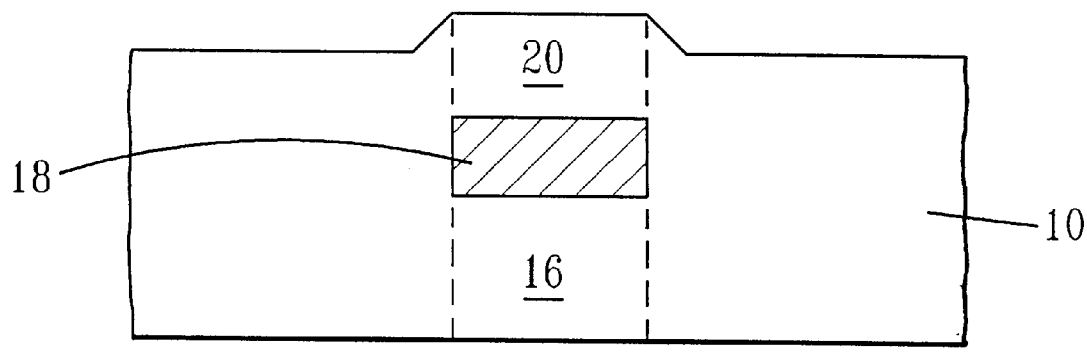

Following the formation of the optional Si layer on the substrate, the structure shown in FIG. 4C is subjected to the above-described annealing step which results in the formation of the structure illustrated in FIG. 4D. In this drawing, a patterned SOI region within the Si-containing substrate is formed. Specifically, FIG. 4D comprises discrete BOX region 18 which electrically isolates superficial Si-containing layer 20 from bottom Si-containing layer 16. Note that the dotted lines in the drawing represent the SOI region that is formed in the Si-containing substrate.

FIGS. 4E–4F show an alternative embodiment wherein optional Si layer 24 is formed only in the at least one opening present in the patterned mask. This structure is shown in FIG. 4E. Next, and with the patterned mask in place, the structure is annealed as discussed above and thereafter the patterned mask is stripped providing the structure shown in FIG. 4F. Note that in this figure, the superficial Si-containing layer extends above the upper surface of the Si-containing substrate.

Figure 4G:
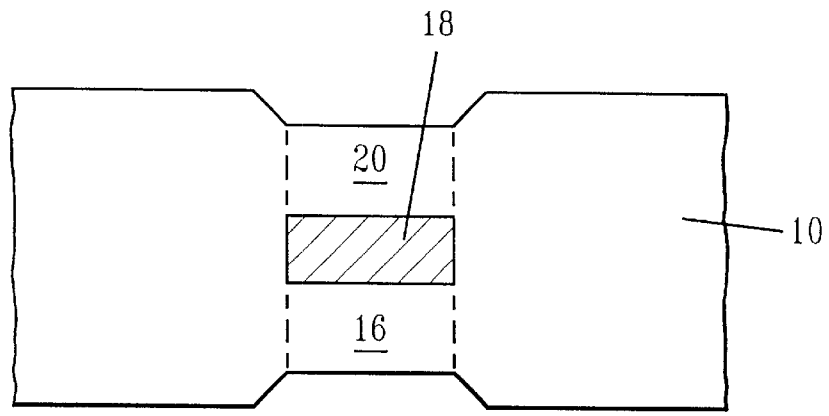

FIG. 4G shows another embodiment of the present invention. The structure illustrated in FIG. 4G is formed by providing a mask over the ion implanted region, forming optional Si layer 24 over the other regions of the substrate that do not contain the patterned mask, annealing in the ambient described above, and removing the patterned mask from the structure.

It should be also noted that during the annealing step of the present invention a surface oxide forms on the surface of the Si-containing substrate. The surface oxide is not shown in the drawings since it is typically removed after annealing using a chemical wet etch process that has a high selectivity for removing oxide as compared with Si.

The thickness of the BOX regions formed in the present invention may vary depending upon the exact embodiment used in fabricating the same. Typically, however, the BOX region of the present invention has a thickness of from about 50 to about 2000 Å, with a thickness of from about 1000 to about 1500 Å being more highly preferred.

Insofar as the top superficial Si-containing layer is concerned, that Si-containing layer may have a variable thickness which is also dependent upon the exact embodiment used in fabricating the same. Typically, however, the superficial Si-containing layer of the SOI subtrate of the present invention has a thickness of from about 100 to about 5000 Å, with a thickness of from about 200 to about 2000 Å being more highly preferred. The thickness of the bottom Si-containing layer is inconsequential to the present invention. Note that the term Si-containing layer has the same meaning as Si-containing substrate defined above.

The SOI substrate of the present invention can be used in forming high-performance semiconductor devices or circuits. Examples of such devices or circuits that can contain the SOI substrate of the present invention include, but are not limited to: microprocessors, memory cells such as dynamic random access memory (DRAM) or static random access memory (SRAM), application specific integrated circuits (ASICs) and larger and more complicated structures. Since these device or circuits are well known in the art, it is not necessary to provide a detail description concerning the same. It is however emphasized that the active devices and/or circuits are typically formed in the top superficial Si layer of the SOI substrate. In addition to being used in the above manner, the inventive SOI substrates may be used in optical communication devices and three-dimensional device and circuit integration.

Figure 5:
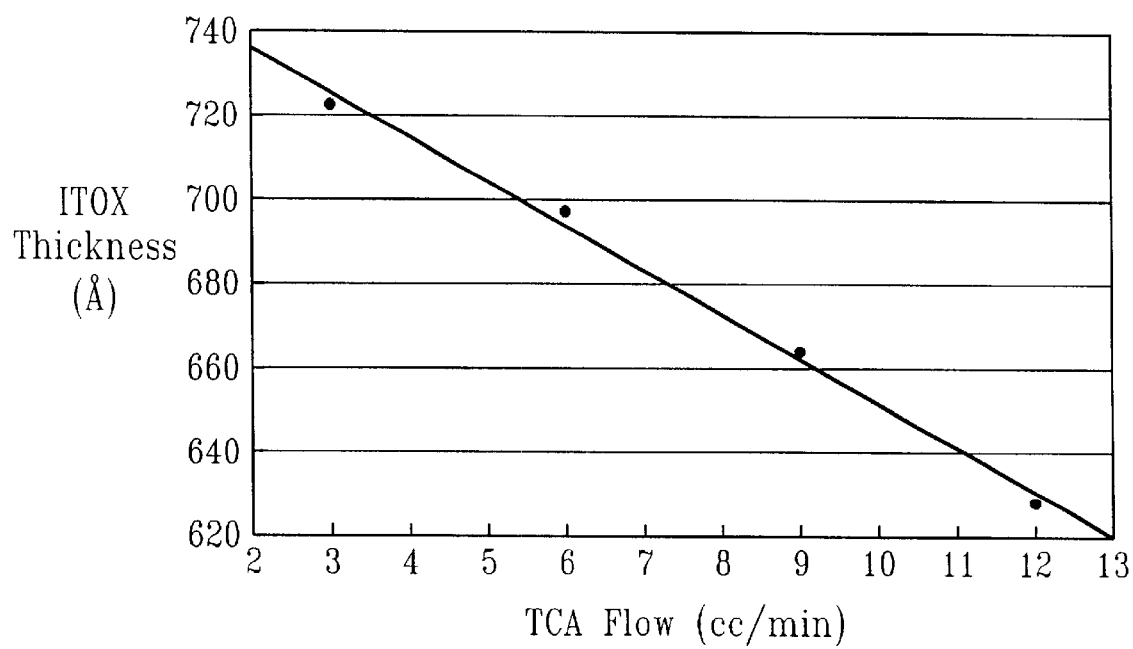
FIG. 5 is a graph plotting ITOX thickness (Å) vs. trichloroethylene, TCA, flow (cc/min) obtained using the inventive SIMOX process. Specifically, this graph shows the effect of TCA flow on ITOX.
Figure 6:
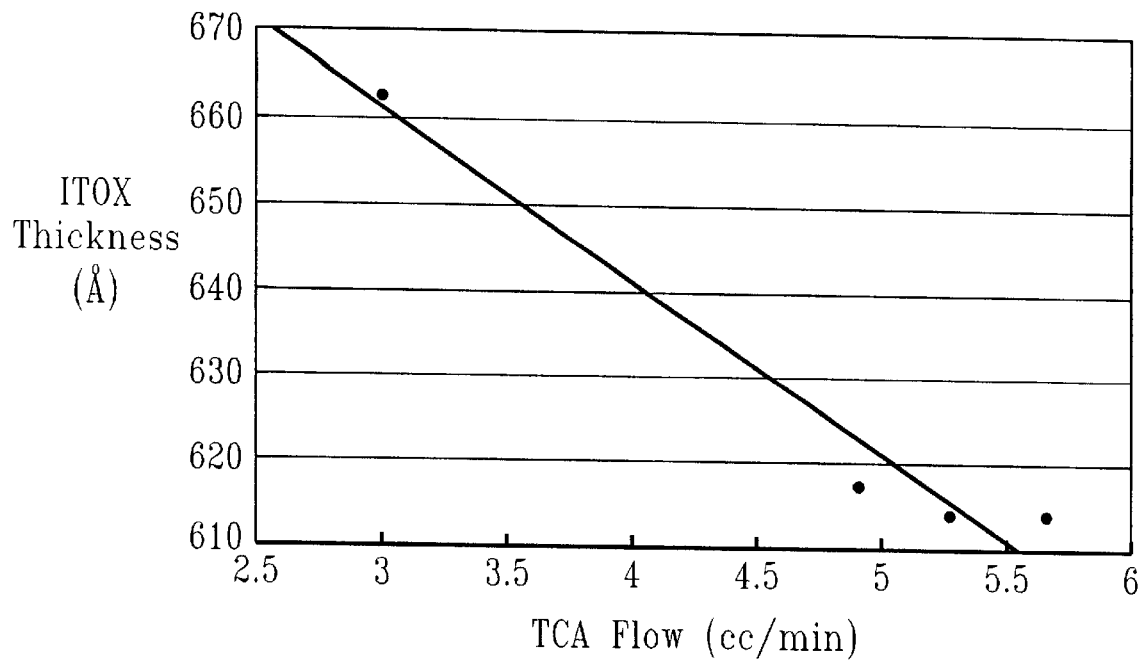
FIG. 6 is a graph of ITOX thickness (Å) vs. trans 1,2-dichloroethane, TLC, flow (cc/min) obtained using the inventive SIMOX process. Specifically, this graph shows the effect of TLC on ITOX.

To illustrate the effect on the chlorine-containing ambient used during the annealing step, reference is made to FIGS. 5–6 which show the effect of chlorine-containing gas source flow on ITOX. As shown in these graphs, increased chlorine-containing gas flow decreases the ITOX thickness. In the present invention, optimal ITOX control is achieved when the flow of chlorine-containing carrier gas to the Si-containing substrate is within the ranges mentioned above.

Figure 7:
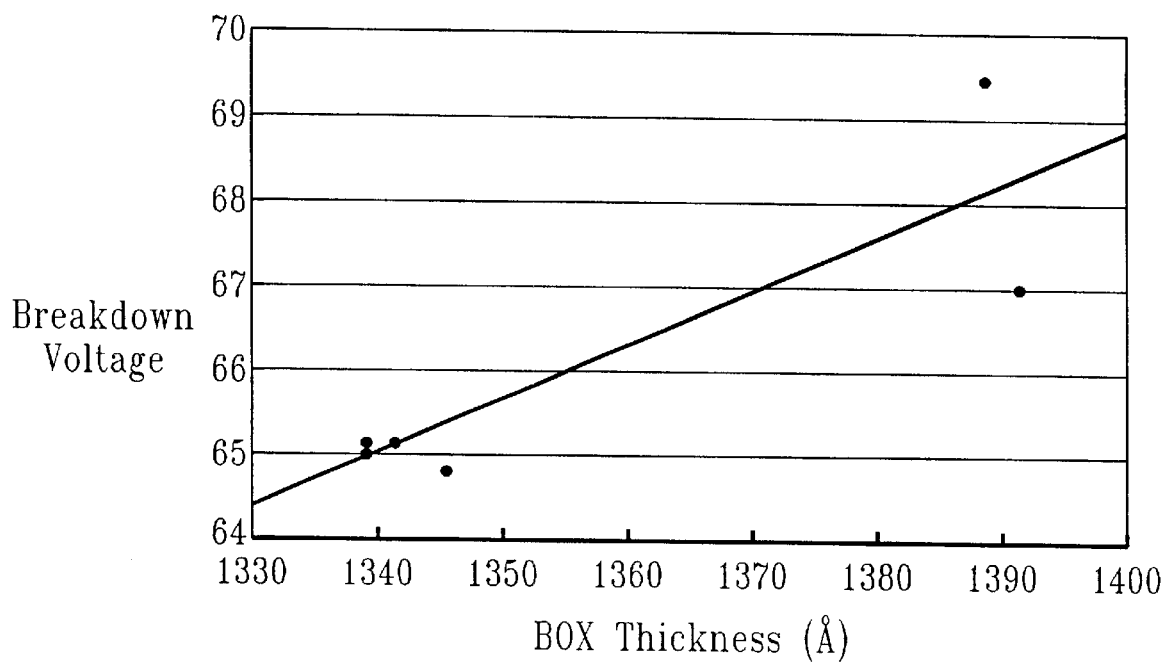
FIG. 7 is a graph plotting breakdown voltage vs. BOX thickness that is obtained using the inventive SIMOX process. Specifically, this graph shows the effect of BOX thickness on breakdown voltage.

FIG. 7 shows the breakdown voltage dependence of the BOX thickness controlled by TCA for a given oxygen implant dose. Note that in this drawing that the breakdown voltage is directly proportional to the BOX thickness.

Figure 8A:
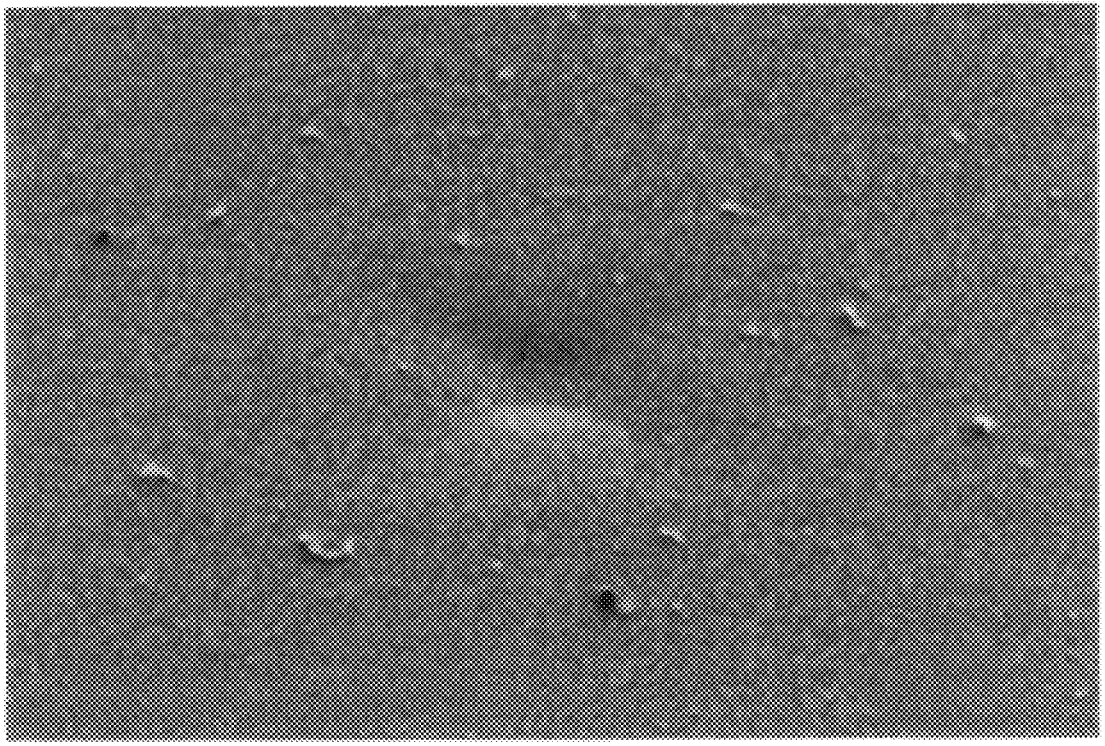
FIGS. 8A–8B are scanning electron micrographs (SEMs) of a SOI substrate prepared in accordance with the inventive method; (A) top view; (B) cross-sectional view.
Figure 8B:
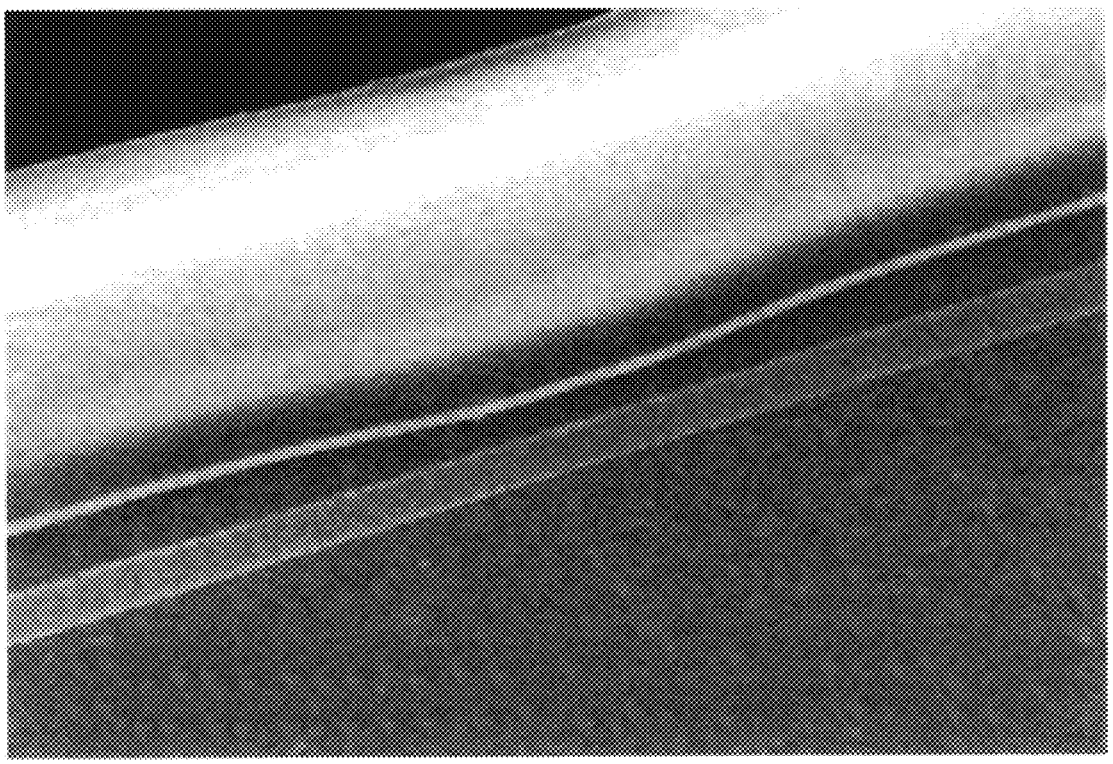

FIGS. 8A–8B show various SEM photographs of a SOI substrate prepared in accordance with the method of the present invention. The important feature to note in each of these photographs is that the SOI substrate contains a reduced number of divots in the top superficial Si-containing layer as compared to what would be observed on a SOI substrate prepared using a prior art process.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail what we claim as new and desire to secure by the Letters Patent is:

1. A method to control the quality of a buried oxide region, and to substantially reduce or eliminate deep divots in SOI substrates, said method comprising the steps of:
 (a) implanting oxygen ions into a surface of a Si-containing substrate; and
 (b) annealing said Si-containing substrate containing said implanted oxygen ions at a temperature of about 1100° C. or above and in a chlorine-containing ambient so as to form a buried oxide region that electrically isolates a superficial Si-containing layer from a bottom Si-containing layer.

2. The method of claim 1 wherein said oxygen ion implantation comprises a base oxygen implant step or a base oxygen implant step followed by a second oxygen implant step which is carried out at lower temperatures than said base oxygen implant step.

3. The method of claim 2 wherein said second oxygen implant step is carried out using an oxygen dose of from about 1E14 to about 1E16 $cm^{-2}$ and at an energy of from about 40 keV or greater.

4. The method of claim 3 wherein said second oxygen implant step is carried out using an oxygen dose of from about 1E15 to about 4E15 $cm^{-2}$ and at an energy of from about 120 to about 450 keV.

5. The method of claim 2 wherein said second oxygen implant step is carried out at a temperature of from about 4K to about 200° C.

6. The method of claim 5 wherein said second oxygen implant step is carried out at a temperature of from about 25° to about 100° C.

7. The method of claim 2 wherein said base oxygen implant comprises a high-dose oxygen implant which is carried out using an oxygen dose of about 4E17 $cm^{-2}$ or greater.

8. The method of claim 7 wherein said high-dose oxygen implant is performed using an oxygen dose of from about 4E17 to about 2E18 $cm^{-2}$.

9. The method of claim 7 wherein said high-dose oxygen implant is carried out at an energy of from about 150 to about 1000 keV.

10. The method of claim 9 wherein said high-dose oxygen implant is carried out at an energy of from about 150 to about 210 keV.

11. The method of claim 7 wherein said high-dose oxygen implant is carried out at a temperature of from about 200° to about 800° C.

12. The method of claim 7 wherein said high-dose oxygen implant is carried out at a temperature of from about 200° to about 600° C.

13. The method of claim 2 wherein said base oxygen implant comprises a low-dose oxygen implant which is carried out using an oxygen dose of about 4E17 $cm^{-2}$ or less.

14. The method of claim 13 wherein said low-dose oxygen implant is performed using an oxygen dose of from about 1E16 to about 3.9E17 $cm^{-2}$.

15. The method of claim 13 wherein said low-dose oxygen implant is carried out at an energy of from about 40 to about 10,000 keV.

16. The method of claim 15 wherein said low-dose oxygen implant is carried out at an energy of from about 40 to about 210 keV.

17. The method of claim 13 wherein said low-dose oxygen implant is carried out at a temperature of from about 100° to about 800° C.

18. The method of claim 17 wherein said low-dose oxygen implant is carried out at a temperature of from about 200° to about 650° C.

19. The method of claim 1 wherein said chlorine-containing ambient comprises from about 0.1 to about 99.9% oxygen and from about $1\times10^{-4}$ to about 3% chlorine-containing carrier gas.

20. The method of claim 19 wherein said chlorine-containing ambient comprises from about 5 to about 70% oxygen and from about 0.03 to about 3% chlorine-containing carrier gas.

21. The method of claim 19 wherein said chlorine-containing carrier gas comprises at least one chlorine-containing compound selected from the group consisting of HCl, trichloroethylene (TCA), trans 1,2-dichloroethane (TLC), methylene chloride and mixtures thereof.

22. The method of claim 21 wherein said chlorine-containing carrier gas comprises TCA or TLC.

23. The method of claim 1 wherein said annealing is performed at a temperature of from about 1100° to about 1400° C. for a time period of from about 1 to about 100 hours.

24. The method of claim 23 wherein said annealing is performed at a temperature of from about 1300° to about 1350° C. for a time period of from about 2 to about 50 hours.

25. The method of claim 1 further comprises forming a Si layer on said Si-containing substrate after step (a), but prior to step (b).

26. The method of claim 25 wherein said Si layer comprises amorphous Si, polySi, epi-Si or combinations and multilayers thereof.

27. The method of claim 1 further comprises forming a patterned mask on said Si-containing substrate prior to step (a).

28. The method of claim 27 wherein said patterned mask is removed prior to step (b).

29. The method of claim 28 wherein a Si layer is formed on said Si-containing substrate after removing said pattern mask.

30. The method of claim 29 wherein said Si layer comprises amorphous Si, polySi, epi-Si or combinations and multilayers thereof.

31. The method of claim 27 wherein said patterned mask remains on the structure through steps (a) and (b).

32. The method of claim 31 wherein a Si layer is formed on exposed portions of said Si-containing substrate not containing said patterned mask.

33. The method of claim 32 wherein said Si layer comprises amorphous Si, polySi, epi-Si or combinations and multilayers thereof.

* * * * *

UNITED STATES PATENT AND TRADEMARK OFFICE
CERTIFICATE OF CORRECTION

PATENT NO. : 6,495,429 B1
DATED : December 17, 2002
INVENTOR(S) : Michael E. Adamcek et al.

It is certified that error appears in the above-identified patent and that said Letters Patent is hereby corrected as shown below:

Column 1,
Line 40, "therm" should read -- thermal --

Column 2,
Line 29, "ternperature" should read -- temperature --

Column 4,
Line 44, "cm 2" should read -- cm$^{-2}$ --

Column 5,
Line 40, "examples. of" should read -- examples of --

Signed and Sealed this

Twenty-second Day of April, 2003

JAMES E. ROGAN
*Director of the United States Patent and Trademark Office*